United States Patent
Onozawa et al.

(10) Patent No.: US 11,353,502 B2
(45) Date of Patent: Jun. 7, 2022

(54) ELECTRONIC COMPONENT HANDLING APPARATUS AND ELECTRONIC COMPONENT TESTING APPARATUS

(71) Applicant: ADVANTEST Corporation, Tokyo (JP)

(72) Inventors: Masataka Onozawa, Tokyo (JP);
Mitsunori Aizawa, Tokyo (JP);
Aritomo Kikuchi, Tokyo (JP)

(73) Assignee: ADVANTEST Corporation, Tokyo (JP)

( * ) Notice: Subject to any disclaimer, the term of this patent is extended or adjusted under 35 U.S.C. 154(b) by 0 days.

(21) Appl. No.: 17/186,846

(22) Filed: Feb. 26, 2021

(65) Prior Publication Data
US 2021/0285999 A1  Sep. 16, 2021

(30) Foreign Application Priority Data

Mar. 12, 2020  (JP) .................... JP2020-000875 U

(51) Int. Cl.
*G01R 1/02* (2006.01)
*G01R 1/04* (2006.01)
(Continued)

(52) U.S. Cl.
CPC ..... *G01R 31/2893* (2013.01); *G01R 31/2887* (2013.01)

(58) Field of Classification Search
CPC . G01R 1/02; G01R 1/04; G01R 1/067; G01R 1/073; G01R 31/00; G01R 31/26; G01R 31/28
See application file for complete search history.

(56) References Cited

U.S. PATENT DOCUMENTS

| 5,812,409 A | 9/1998 | Kanno et al. |
| 2008/0059095 A1* | 3/2008 | Ichikawa ........... G01R 31/2893 702/81 |

(Continued)

FOREIGN PATENT DOCUMENTS

| JP | 2008-290877 A | 12/2008 |
| JP | 2010-010282 A | 1/2010 |

(Continued)

OTHER PUBLICATIONS

Office Action issued in corresponding Singapore Patent Application No. 10202101865R, dated Apr. 4, 2022 (8 pages).

*Primary Examiner* — Neel D Shah
(74) *Attorney, Agent, or Firm* — Osha Bergman Watanabe & Burton LLP

(57) ABSTRACT

An electronic component handling apparatus handles a device under test (DUT). The electronic component handling apparatus includes: a set plate that holds a DUT container including a plurality of pockets each of which accommodates the DUT; a sensor that acquires three-dimensional shape data of the DUT container; and a processor that corrects the shape data based on an inclination of the set plate, extracts a height and an inclination of a predetermined region corresponding to the DUT in a first pocket among the pockets, from the shape data corrected by the processor, and determines an accommodation state of the DUT in the first pocket based on an extraction result obtained by the processor.

10 Claims, 10 Drawing Sheets

(51) Int. Cl.
   *G01R 1/067*   (2006.01)
   *G01R 1/073*   (2006.01)
   *G01R 31/00*   (2006.01)
   *G01R 31/26*   (2020.01)
   *G01R 31/28*   (2006.01)

(56) References Cited

U.S. PATENT DOCUMENTS

2008/0317575 A1* 12/2008 Yamazaki .......... G01R 31/2893
                                                   414/754
2012/0043983 A1*  2/2012 Sawa ................ G01R 31/2891
                                                   324/750.19
2018/0180669 A1   6/2018 Kotani

FOREIGN PATENT DOCUMENTS

| | | |
|---|---|---|
| JP | 2011-232275 A | 11/2011 |
| JP | 2011-249704 A | 12/2011 |
| JP | 2014-25723 A | 2/2014 |
| WO | 2008/044305 A1 | 4/2008 |
| WO | 2009/060515 A1 | 5/2009 |

\* cited by examiner

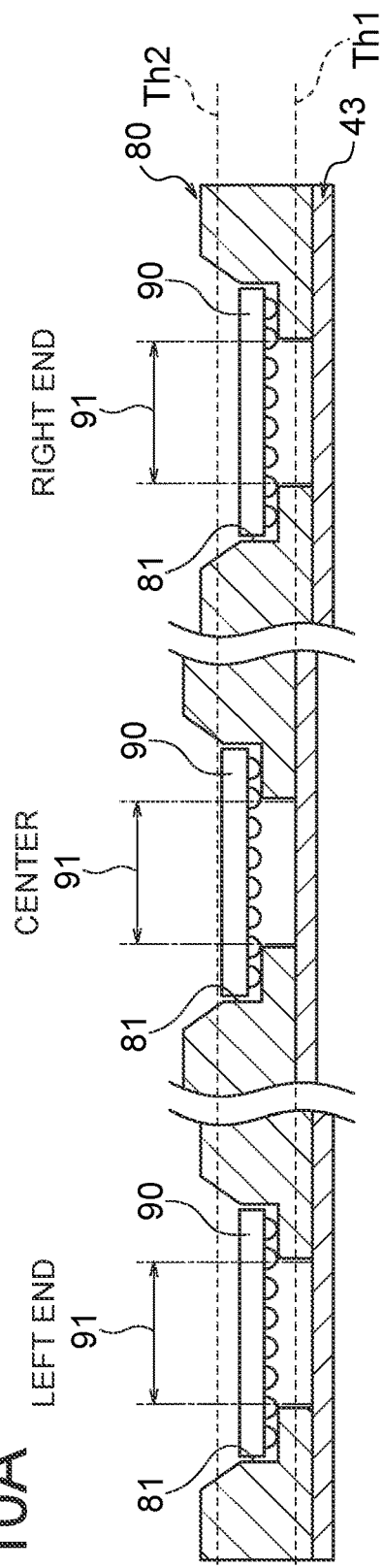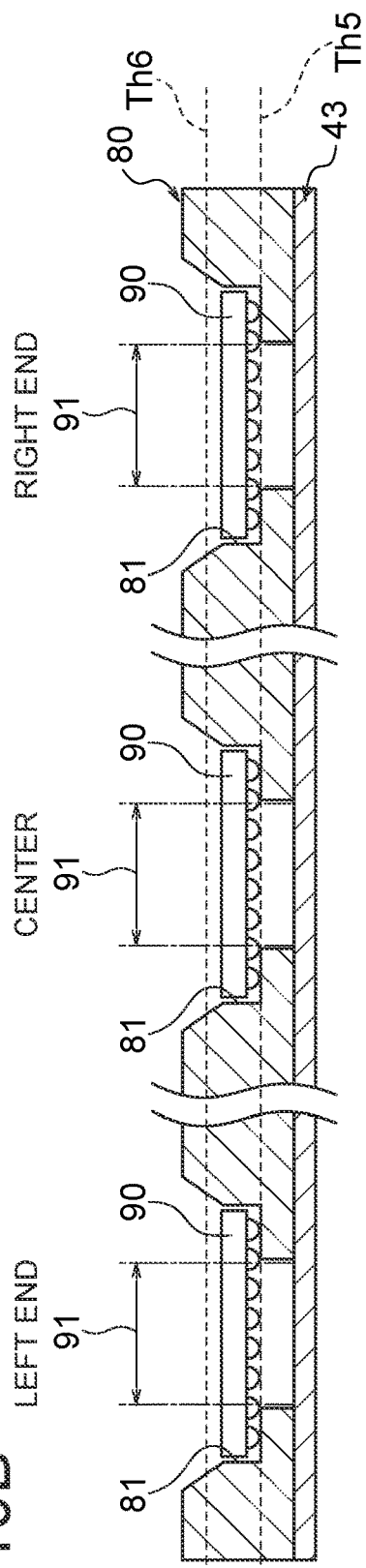

ELECTRONIC COMPONENT HANDLING APPARATUS AND ELECTRONIC COMPONENT TESTING APPARATUS

CROSS-REFERENCE TO RELATED APPLICATIONS

The application claims priority from Japanese Patent Application for a Utility Model Registration No. 2020-000875U filed on Mar. 12, 2020, the contents of which are incorporated herein by reference in their entirety.

BACKGROUND

Technical Field

The present invention is an electronic component handling apparatus that handles the DUT for testing the electronic component under test (DUT: Device Under Test) such as a semiconductor integrated circuit device, and an electronic component testing apparatus that has the electronic component handling apparatus.

Description of the Related Art

In the electronic component handling apparatus, a customer tray that accommodates an untested DUT is held by a set plate and is exposed from a main base of the handler through a window, and the DUT is picked up and transported from the customer tray by a pick-and-place device (for example, refer to Patent Document 1). In the electronic component handling apparatus, when the test of the DUT is completed, the DUT is moved by the pick-and-place device and is accommodated in the customer tray held by the set plate, thereby classifying according to the test result is performed.

Patent Document

Patent Document 1 WO 2008-044305

In the electronic component handling apparatus described above, if a pocket in which the DUT is not accommodated is present in the customer tray, the pick-and-place device may stop due to the pocket. Also, if the DUT is accommodated in the pocket of the customer tray in inclined state, or if two DUTs are accommodated in one pocket in overlapping state, the pick-and-place device may damage the DUT.

SUMMARY

One or more embodiments of the present invention provide an electronic component handling apparatus capable of improving the apparatus operation rate and suppressing the breakage of the DUT, and an electronic component testing apparatus having the electronic component handling device.

[1] An electronic component handling apparatus according to one or more embodiments of the present invention is an electronic component handling apparatus that handles a DUT, comprising: a holding means (i.e., a set plate) that holds a DUT container having a plurality of accommodating portions (i.e., pockets) each of which is capable of accommodating the DUT; an acquiring means (i.e., a sensor) that acquires three-dimensional shape data of the DUT container; a first correcting means (i.e., a processor) that corrects the shape data on the basis of an inclination of the holding means; an extracting means (i.e., the processor) that extracts a height and inclination of a predetermined region corresponding to the DUT in the accommodating portion from the shape data corrected by the first correcting means; and a first determining means (i.e., the processor) that determines an accommodation state of the DUT in the accommodating portion on the basis of an extraction result of the extracting means.

[2] In one or more embodiments, the first determining means may determine that the DUT is not accommodated in the accommodating portion when the height of the predetermined region is less than a first threshold, may determine that a plurality of the DUTs are accommodated in the accommodating portion when the height of the predetermined region is greater than a second threshold greater than the first threshold, and may determine that the DUT is normally accommodated in the accommodating portion when the height of the predetermined region is greater than or equal to the first threshold and less than or equal to the second threshold.

[3] In one or more embodiments, the first determining means may determine that the DUT is inclined in the accommodating portion when the inclination of the predetermined region is less than a third threshold or greater than a fourth threshold greater than the third threshold, and may determine that the DUT is normally accommodated in the accommodating portion when the inclination of the predetermined region is greater than or equal to the third threshold and less than or equal to the fourth threshold.

[4] In one or more embodiments, the electronic component handling apparatus may include a second correcting means (i.e., the processor) that corrects the height and inclination of the predetermined region in the accommodating portion on the basis of the height and inclination of the predetermined region corresponding to the DUT in another accommodating portion adjacent to the accommodating portion, and a second determining means (i.e., the processor) that again determines the accommodation state of the DUT in the accommodating portion on the basis of the height and inclination of the predetermined region corrected by the second correcting means, and the other accommodating portion may be an accommodating portion in which the accommodation state of the DUT is determined to be normal by the first determining means.

[5] In one or more embodiments, the second determining means may determine that the DUT is not accommodated in the accommodating portion when the height of the predetermined region after correction is less than a fifth threshold, may determine that a plurality of DUTs are accommodated in the accommodating portion when the height of the predetermined region after correction is greater than a sixth threshold greater than the fifth threshold, may determine that the DUT is normally accommodated in the accommodating portion when the height of the predetermined region after correction is greater than or equal to the fifth threshold and less than or equal to the sixth threshold, and an interval between the fifth threshold and the sixth threshold may be narrower than an interval between the first threshold and the second threshold.

[6] In one or more embodiments, the second determining means may determine that the DUT is inclined in the accommodating portion when the inclination of the predetermined region after correction is less than the seventh threshold or greater than the eighth threshold, and may determine that the DUT is normally accommodated in the accommodating portion when the inclination of the predetermined region after correction is greater than or equal to the seventh threshold and less than or equal to the eighth threshold, and an angle between the seventh threshold and the eighth threshold may be narrower than an angle between the third threshold and the fourth threshold.

[7] In one or more embodiments, the DUT container may be a tray having a plurality of concave pockets each of which is capable of accommodating the DUT.

[8] In one or more embodiments, the acquiring means may measure a specific position of a jig held by the holding means or a specific position of the holding means to acquire the inclination of the holding means in advance.

[9] In one or more embodiments, the acquiring means may include a sensor that acquires the three-dimensional shape data of the DUT container by the light-section method, and the first correcting means may correct the shape data so that the DUT container is substantially horizontal on the basis of the inclination of the holding means acquired by the sensor.

[10] In one or more embodiments, the electronic component handling apparatus may include a storage means that stores the inclination of the holding means.

[11] Electronic component testing apparatus according to one or more embodiments of the present invention is an electronic component testing apparatus that tests a DUT, comprising: a test head that has a socket to which the DUT is electrically connected, the above-described electronic component handling apparatus that moves the DUT to press the DUT against the socket, and a tester that is electrically connected to the test head.

According to one or more embodiments of the present invention, the acquiring means acquires the three-dimensional shape data of the DUT container, the extracting means extracts the height and incline of the predetermined region from the shape data, and the first determining means determines the accommodation state of the DUT on the basis of the extraction result.

Therefore, according to one or more embodiments of the present invention, before the pick-and-place device approaches the accommodating portion, the accommodating portion in which the accommodation state of the DUT is abnormal can be detected in advance, so that it is possible to improve the operation rate of the electronic component handling apparatus and to suppress the damage of the DUT.

Further, in one or more embodiments of the present invention, since the first correcting means corrects the shape data of the DUT container on the basis of the inclination of the holding means, and the extracting means extracts the height and inclination of the predetermined region from the shape data after correction, it is possible to improve the determination accuracy of the accommodation state of the DUT.

BRIEF DESCRIPTION OF DRAWINGS

FIG. 8A is a diagram showing a state in which the accommodation state of the DUT is normal, and FIGS. 8B to 8D are diagrams showing a state in which the accommodation state of the DUT is abnormal.

FIGS. 10A-10B are diagrams for explaining the second correction processing in step S60 and the second determination processing in step S70 in FIG. 6.

DETAILED DESCRIPTION

Hereinafter, embodiments of the present invention will be described with reference to the drawings.

Figure 1:
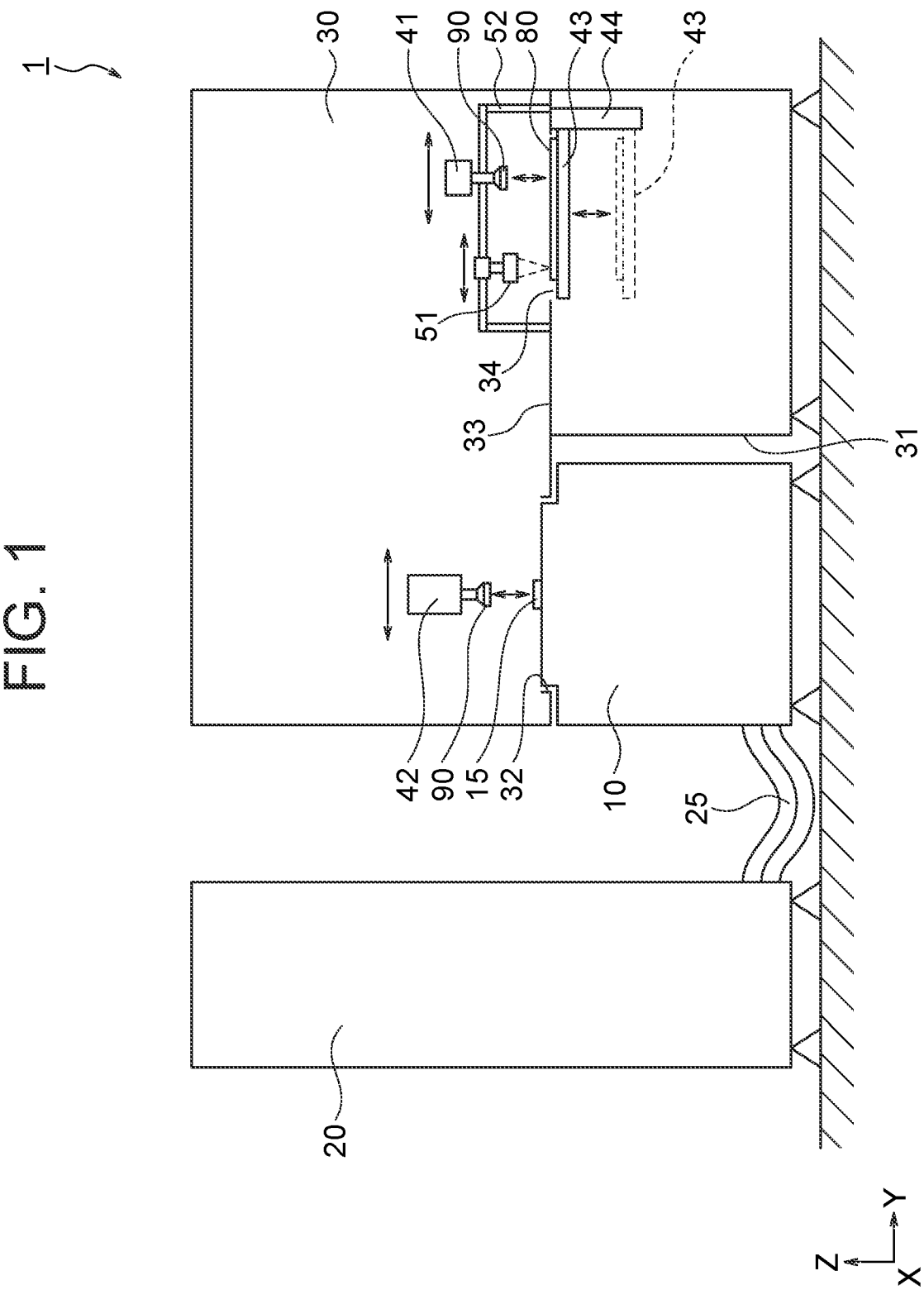
FIG. 1 is a schematic cross-sectional view showing an electronic component testing apparatus in one or more embodiments of the present invention.
Figure 2:
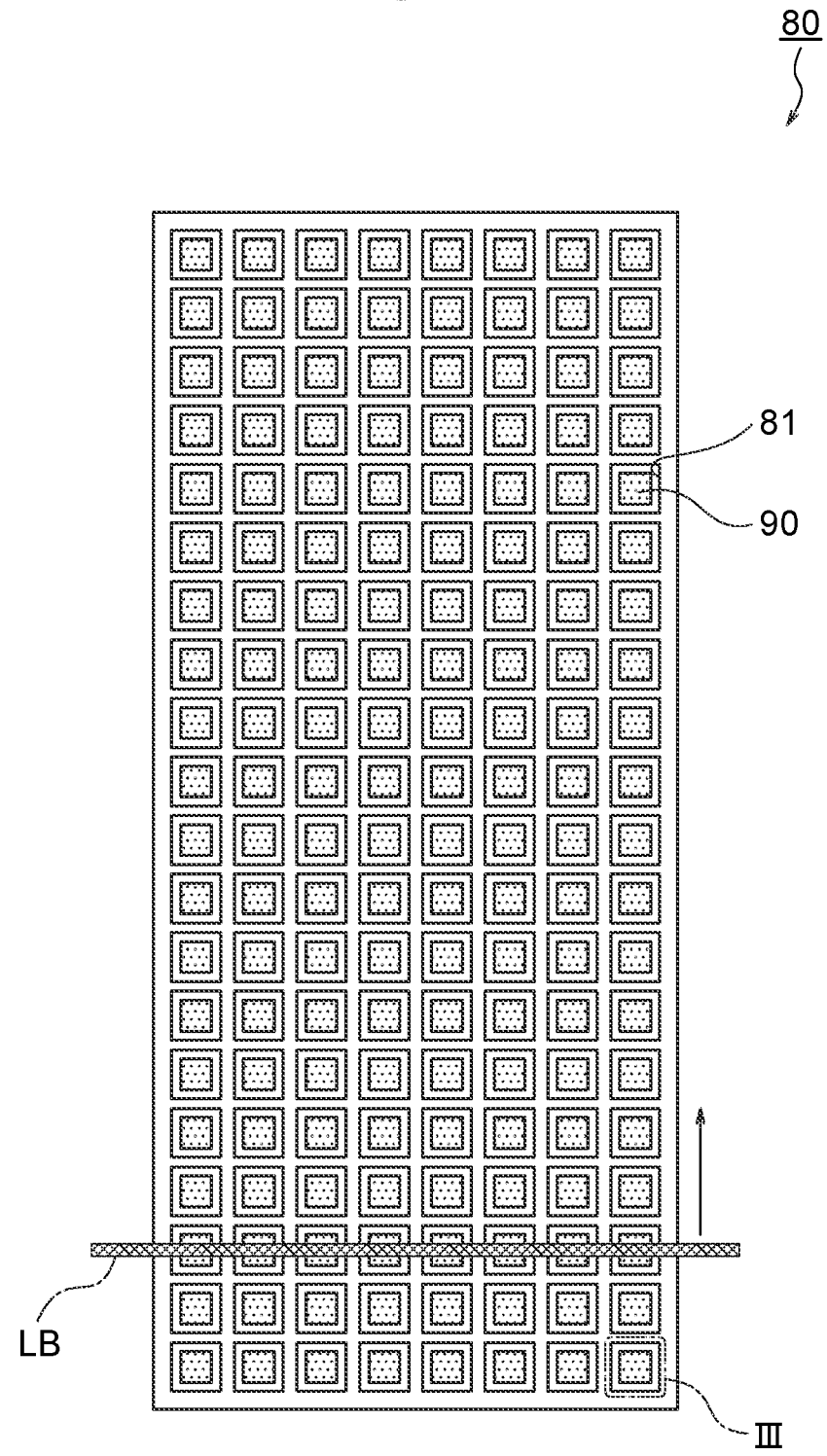
FIG. 2 is a plan view showing a customer tray used in one or more embodiments of the present invention.
Figure 3:
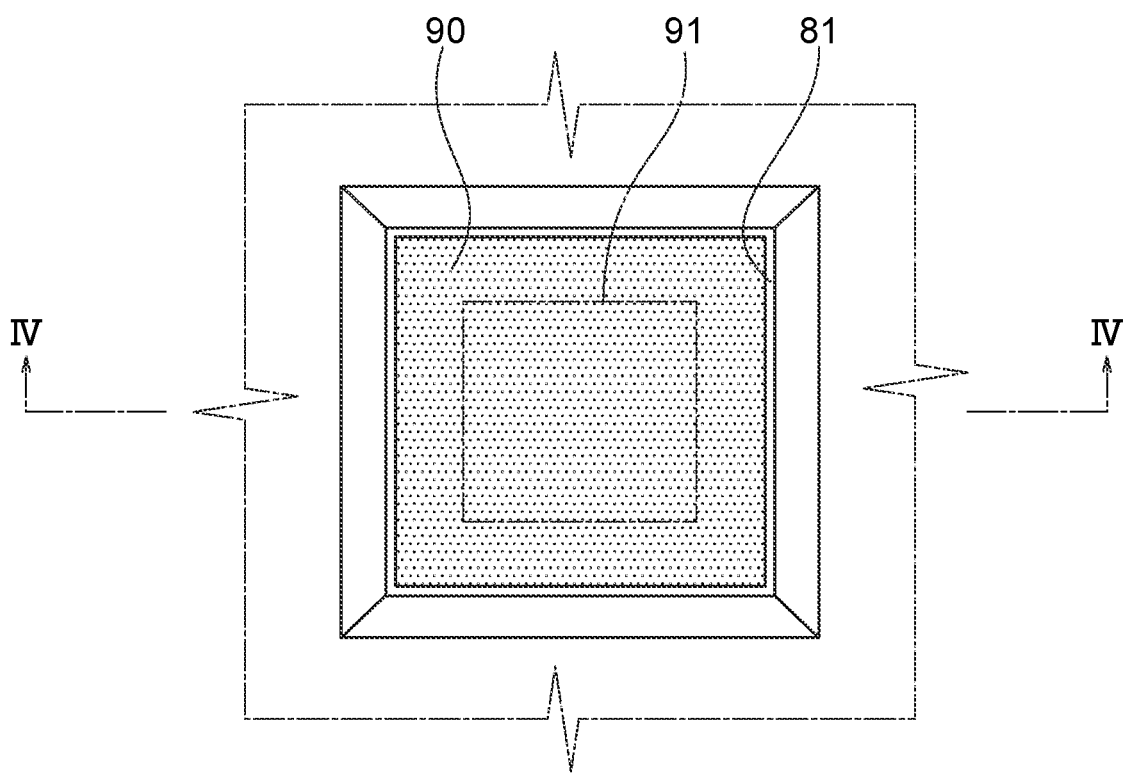
FIG. 3 is an enlarged view of the III portion of FIG. 2.
Figure 4:
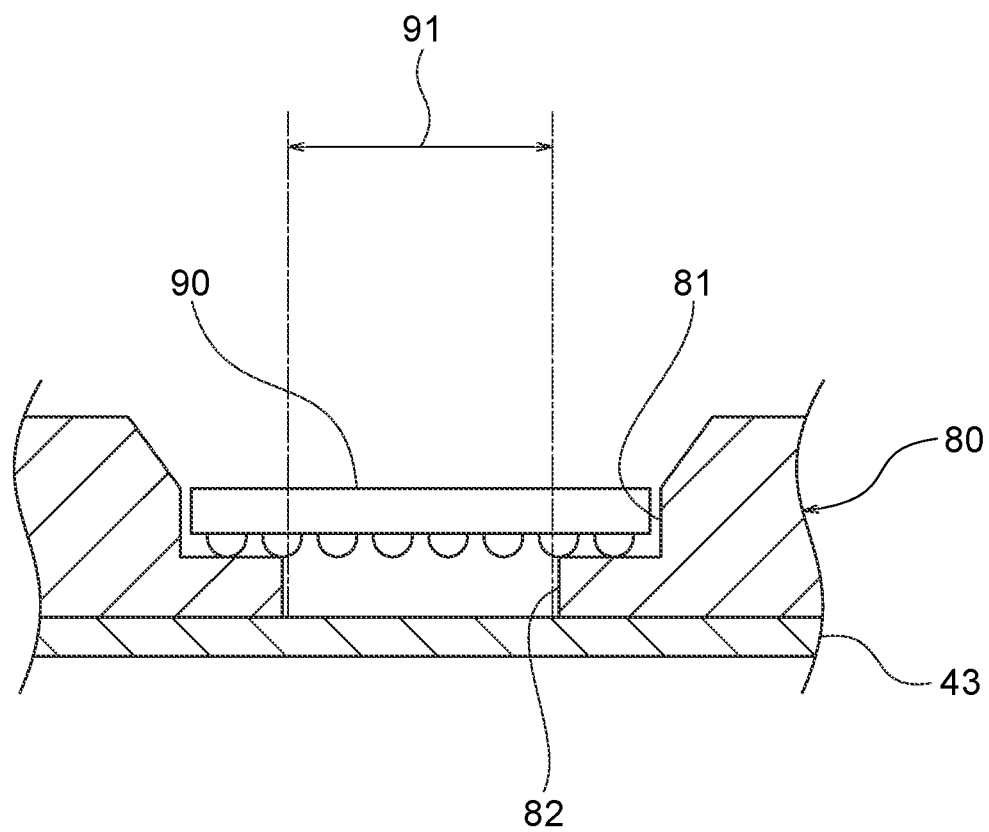
FIG. 4 is a cross-sectional view taken along line IV-IV of FIG. 3.
Figure 5:
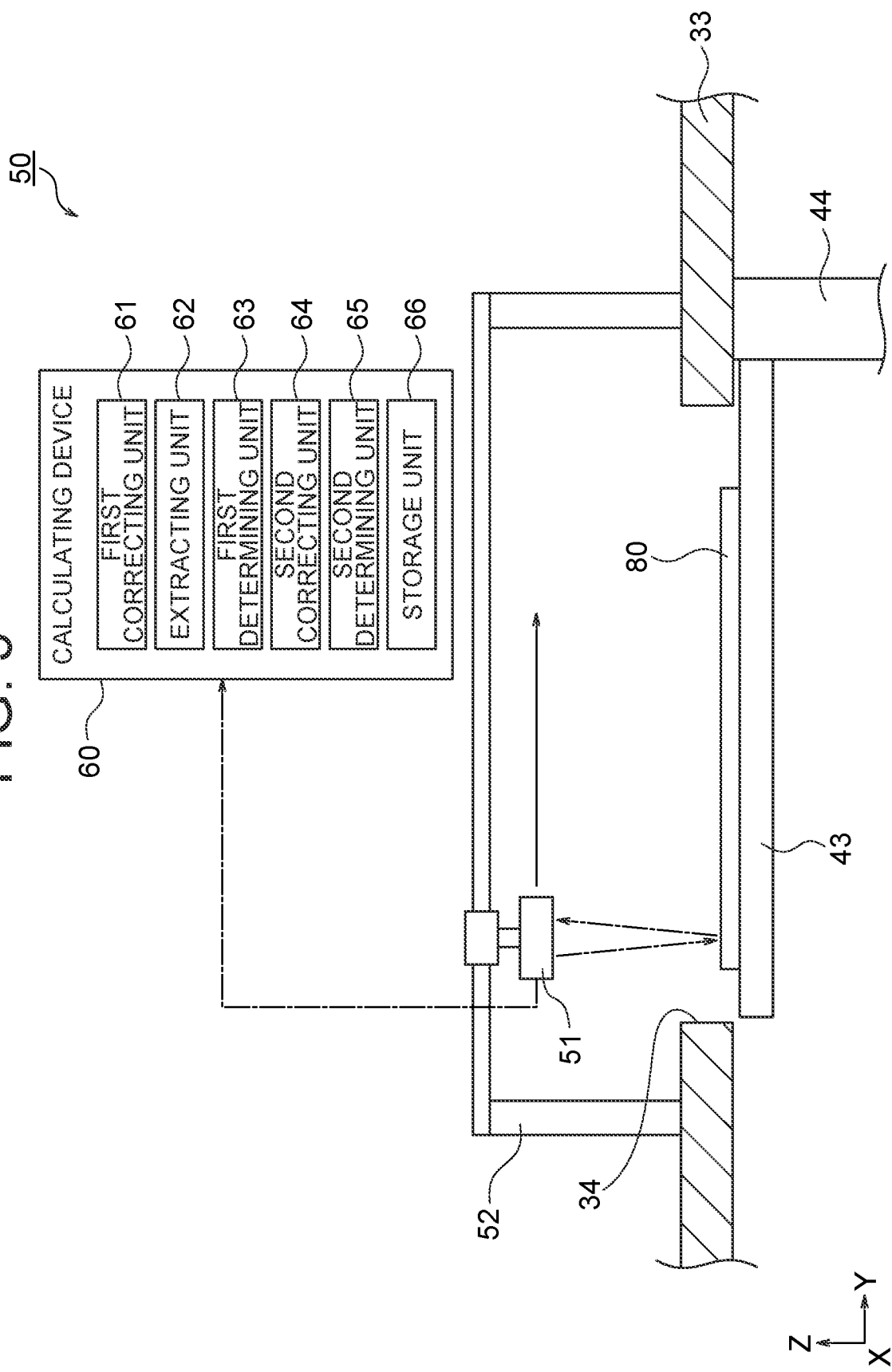
FIG. 5 is a diagram illustrating a configuration of an accommodation state determining device in one or more embodiments of the present invention.

FIG. 1 is a schematic cross-sectional view showing an electronic component testing apparatus in one or more embodiments, FIG. 2 is a plan view showing a customer tray used in one or more embodiments, FIG. 3 is an enlarged view of the III portion of FIG. 2, FIG. 4 is a cross-sectional view along line IV-IV of FIG. 3, FIG. 5 is a diagram showing the configuration of the accommodation state determining device in one or more embodiments.

The electronic component testing apparatus 1 in one or more embodiments is an apparatus that tests the electric characteristics of DUT 90 in a state in which thermal stress of high temperature or low temperature (or in a state of normal temperature) is applied to DUT 90, and classifies DUT 90 according to the test result. Specific examples of the DUT 90 to be tested include a SoC (System on a chip) and a logic device. The DUT 90 to be tested by the electronic component testing apparatus 1 is not particularly limited to the above as long as it is an electronic component, and may be, for example, a memory device.

As shown in FIG. 1, the electronic component testing apparatus 1 includes a test head 10, a tester (main frame) 20, and a handler 30. The test head 10 has sockets 15 to which a DUT 90 is electrically connected during testing. A tester 20 is connected to the test head 10 via a cable 25. The tester 20 sends test signals to DUT 90 via the test head 10, and performs a test of DUT 90. The test head 10 is disposed interchangeably in a space 31 formed in a lower portion of the handler 30, and the socket 15 is inserted into the handler 30 through an opening 32 formed in the handler 30.

The handler 30 picks up the untested DUT 90 from the customer tray 80 by the pick-and-place device 41 and sequentially transfers it onto the test head 10, and presses DUT 90 against the socket 15 by the contact arm 42 to electrically connect DUT 90 to the socket 15. In this state, the tester 20 executes DUT 90 test.

Here, the customer tray 80 is a tray conforming to JEDEC (Joint Electron Device Engineering Council) standard, and as shown in FIGS. 2 to 4, is a plate-shaped tray having a plurality of pockets 81. Each of the pockets 81 is a recess capable of accommodating a DUT 90. In the customer tray 80, a plurality of such pockets 81 are formed in a matrix. Since this custard tray 80 is made of, for example, a resin material, deflection may occur.

The customer tray 80 accommodating the untested DUT 90 is set under the main base (the device board) 33 of the handler 30 (see FIG. 1) while the customer tray 80 is accommodated in a stocker (not shown). The customer tray 80 is conveyed from the stocker to the set plate 43 by a tray transfer arm (not shown). As shown in FIG. 1, a window portion 34 is formed in the main base 33 of the handler 30, and when the set plate 43 is raised by the lifting device 44, the customer tray 80 is exposed from the main base 33 and positioned in the loader section of the handler 30. The pick-and-place device 41 of the loader section picks up and transports the pre-test DUT 90 from the customer tray 80 held by the set-plate 43.

When the test of DUT 90 is completed, the handler 30 carries out the tested DUT 90 from the test head 10 by the contact arm 42, and puts the tested DUT 90 in the customer tray 80 by the pick-and-place device of the unloader section, thereby classifying DUT 90 according to the test result. The customer tray 80 accommodating the tested DUT 90 is also held by the set-plate and positioned in the unloader section of the handler 30.

As shown in FIGS. 1 and 5, the handler 30 in one or more embodiments includes an accommodation state determining device 50 that determines whether or not DUT 90 is normally accommodated in the pockets 81 of the customer tray 80. The accommodation state determining device 50 includes a sensor 51, a moving device 52, and a calculating device 60 (i.e., the processor). In FIGS. 1 and 5, although the accommodation state determining device 50 provided in the loader section of the handler 30 is illustrated, the accommodation state determining device having the same configuration is also provided in the unloader section of the handler 30.

The sensor 51 is a sensor that measures the three-dimensional shape of the customer tray 80 held by the set plate 43 in a non-contact manner. As a specific example of the measurement method of the three-dimensional shape of the non-contact method, for example, a light-section method can be exemplified. The sensor 51 includes, for example, a light irradiation unit that forms a linear light-section line on the surface of the measurement object by irradiating a linear laser beam LB (see FIGS. 2 and 7) with respect to the measurement object, and an imaging unit that images the light-section line. The method of measuring the three-dimensional shape of the customer tray 80 is not limited to the light-section method described above, the three-dimensional shape of the customer tray 80 may be measured using other techniques such as, for example, a fringe projection method or a laser displacement meter.

The moving device 52 is a device that moves the sensor 51 along the Y-direction in the drawing. The moving device 52 is provided on the main base 33 so as to straddle the window portion 34, it is possible to relatively move the sensor 51 with respect to the customer tray 80 which is held by the set plate 43. Three-dimensional shape data of the surface of the customer tray 80 can be obtained by irradiating a laser beam LB to the customer tray 80 from the sensor 51 and imaging the light-section line formed on the surface of the customer tray 80 while the moving device 52 relatively moves the sensor 51 relative to the customer tray 80.

The three-dimensional shape data of the customer tray 80 acquired by the sensor 51 is transmitted to the calculating device 60. The calculating device 60, for example, is composed of a computer including CPU, ROM, RAM or the like. The calculating device 60 of one or more embodiments functionally includes a first correcting unit 61, an extracting unit 62, a first determining unit 63, a second correcting unit 64, a second determining unit 65, and a storage unit 66. These functions 61 to 66 are implemented by software installed in the above-described computer comprising the calculating device 60.

Hereinafter, the functions of the respective units 61 to 66 included in the calculating device 60 will be described by referring to FIGS. 6 to 10B, together with the explanation of the procedures for determining an accommodation state of DUT 90 by the accommodation state determining device 50.

Figure 6:
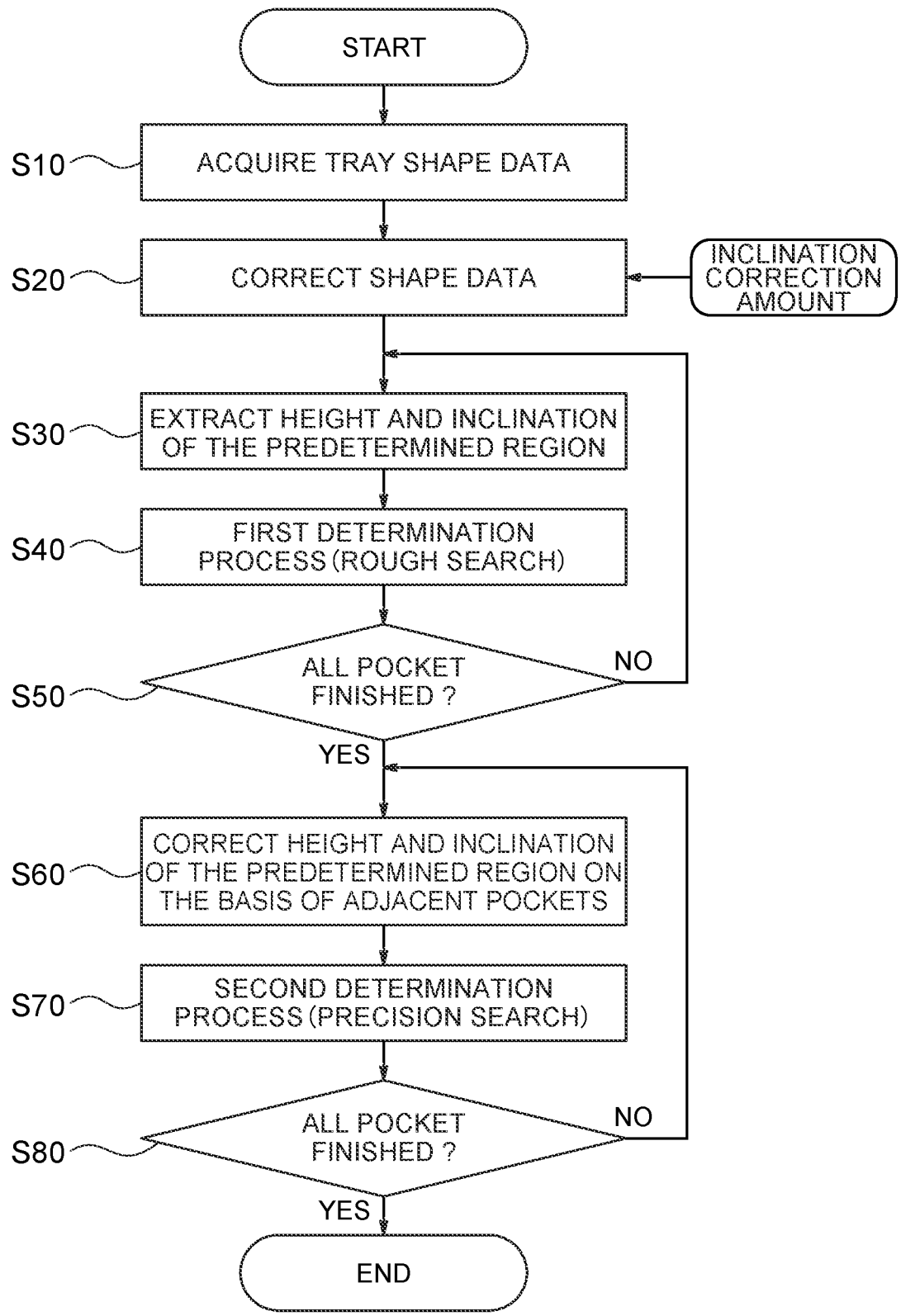
FIG. 6 is a flowchart illustrating a determination method by the accommodation state determining device in one or more embodiments of the present invention.
Figure 7:
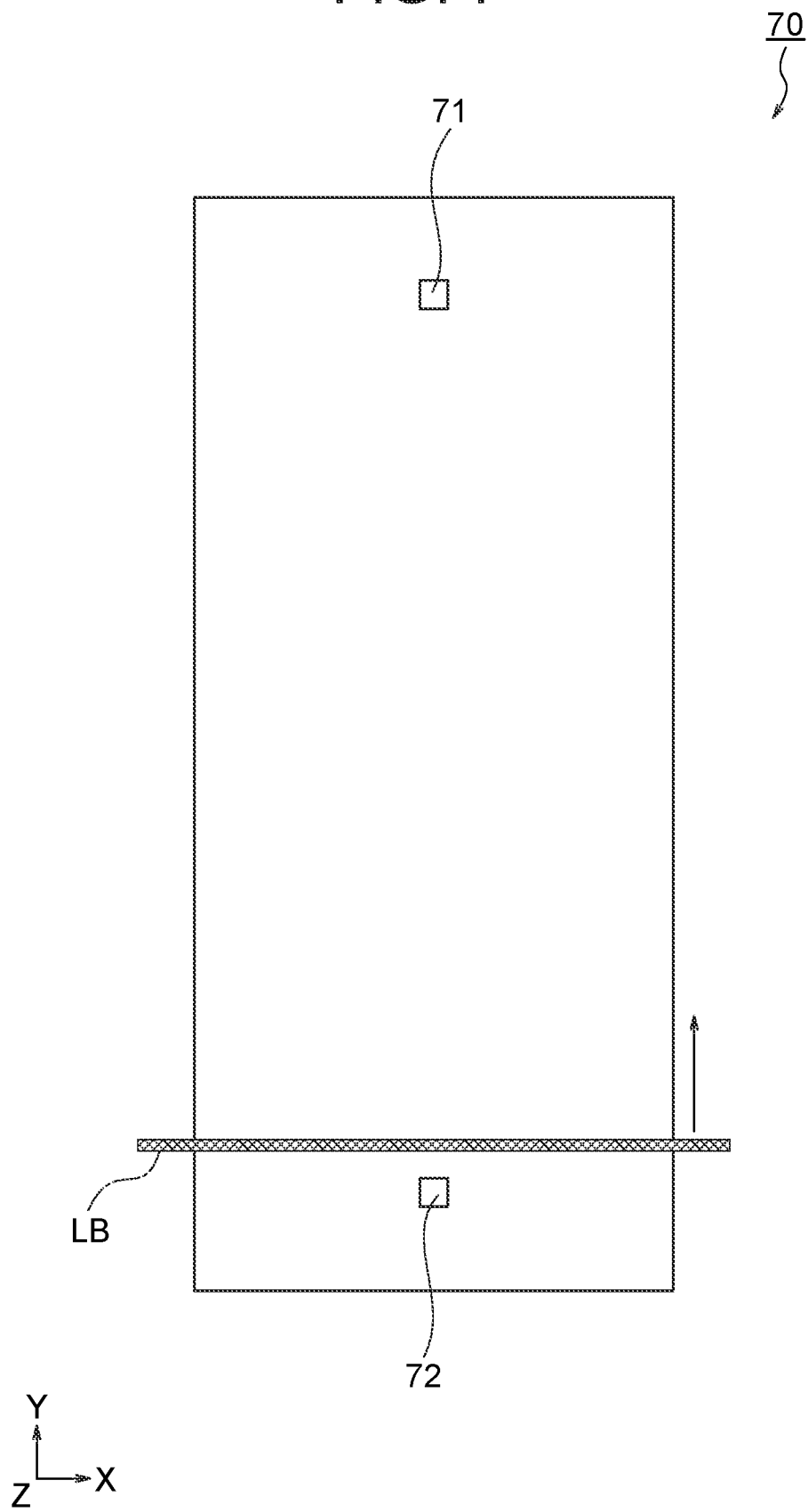
FIG. 7 is a plan view showing a jig used in one or more embodiments of the present invention.
Figure 8A:
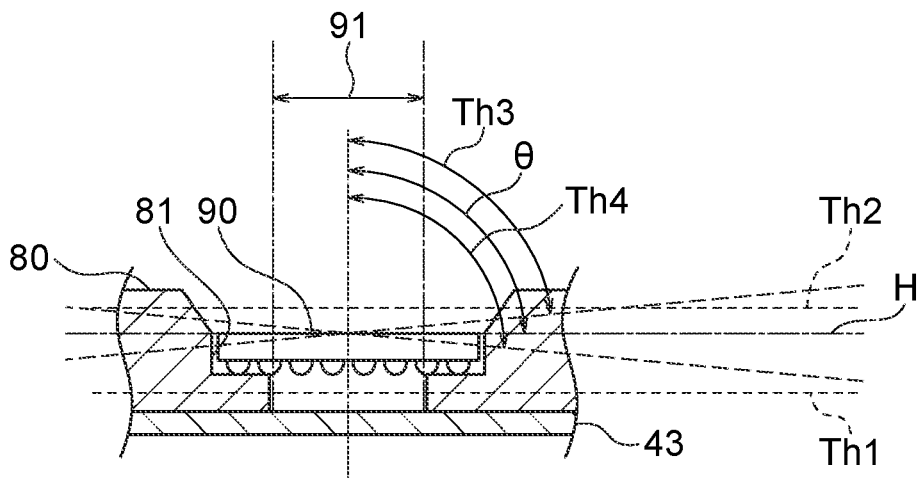
FIGS. 8A to 8D are diagrams showing the first determination processing in step S40 of FIG. 6.
Figure 8B:
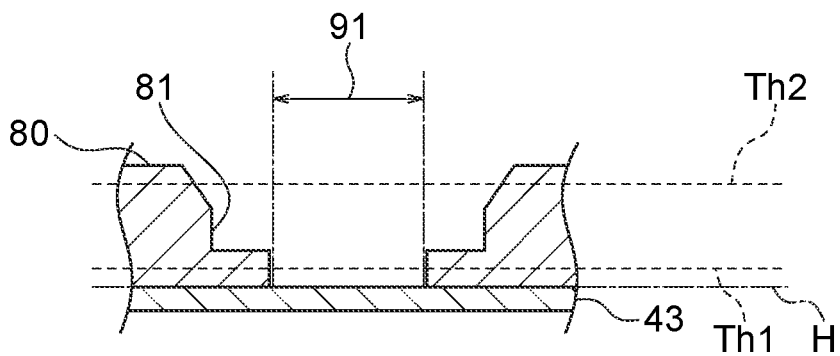
Figure 8C:
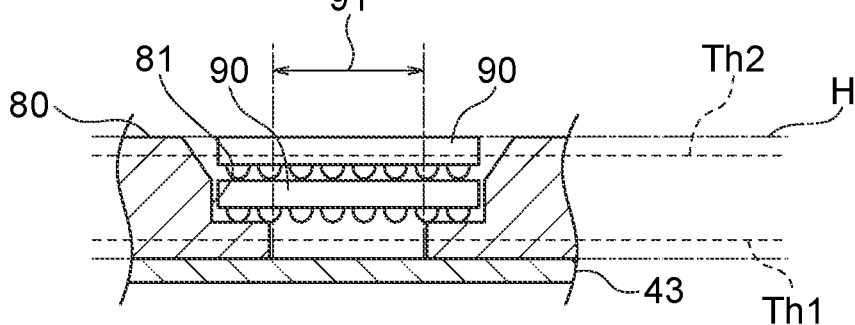
Figure 8D:
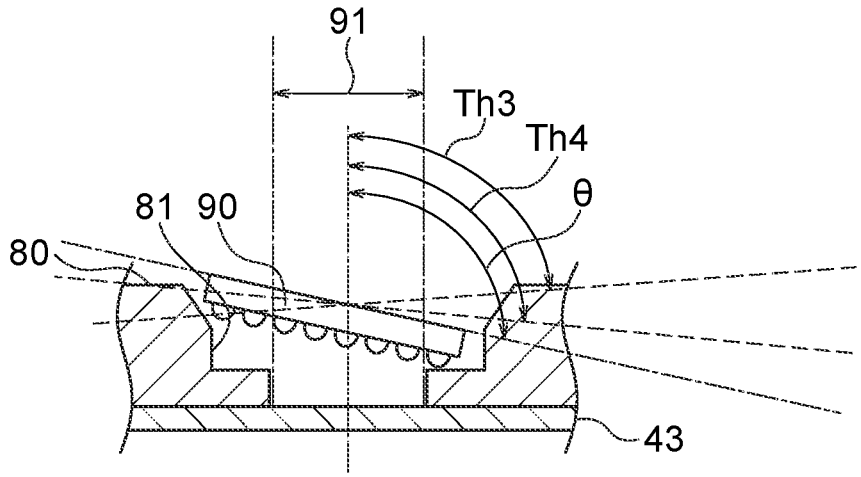
Figure 9:
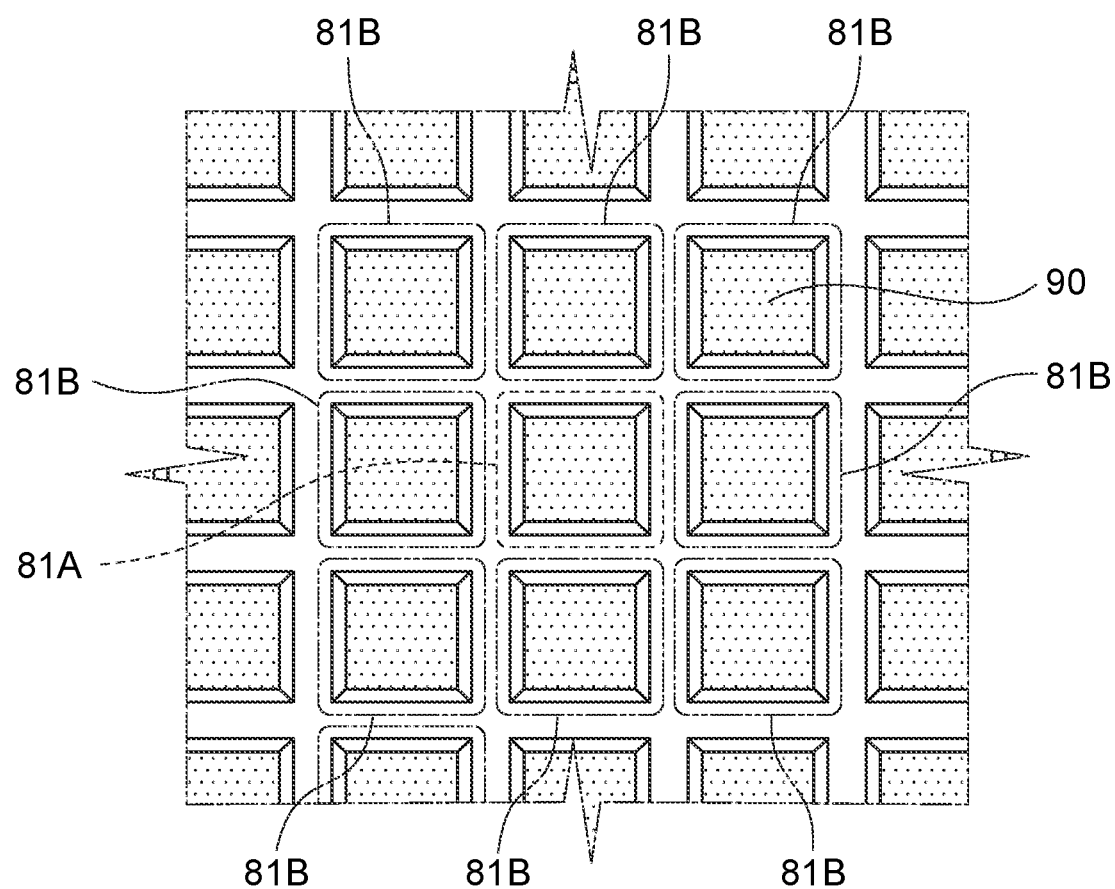
FIG. 9 is a diagram for explaining the second correction processing in step S60 of FIG. 6.
Figure 9:
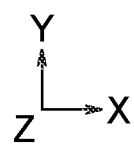

FIG. 6 is a flowchart illustrating a determination method by the accommodation state determining device in one or more embodiments, FIG. 7 is a plan view illustrating a jig used in one or more embodiments, FIG. 8A to FIG. 8D are diagrams illustrating the first determination processing in step S40 of FIG. 6, FIG. 9 is a diagram illustrating the second correction processing in step S60 of FIG. 6, and FIG. 10 is a diagram illustrating the second correction processing in step S60 of FIG. 6 and the second determination processing in step S70.

First, in S10 of FIG. 6, the accommodation state determining device 50 moves the sensor 51 relative to the customer tray 80 by moving device 52 while measuring the shapes of the surfaces of the customer tray 80 by the sensor 51. Thereby, three-dimensional shape data (point data group) of the entire customer tray 80 held by the set plate 43 is acquired. The shape data of the customer tray 80 is transmitted from the sensor 51 to the calculating device 60.

Next, in step S20 of FIG. 6, in order to eliminate the influence of the inclination of the set plate 43, the first correcting unit 61 of the calculating device 60 corrects the shape data of the customer tray 80 on the basis of the inclination correction amount of the set plate 43. Specifically, the first correcting unit 61 reads the inclination correction amount of the set plate 43 from the storage unit 66 and corrects the shape data of the customer tray 80 so as to cancel the inclination correction amount and make the shape data of the customer tray 80 substantially horizontal.

Here, the inclination correction amount of the set plate 43 is obtained in advance by the accommodation state determining device 50 in the following manner prior to starting the test of DUT 90 by the electronic component test apparatus 1.

That is, first, the jig 70 shown in FIG. 7 is set on the set plate 43 instead of the customer tray 80. The jig 70 is a separate (independent) member from the customer tray 80. However, as shown in FIG. 7, the jig 70 is a plate having substantially the same outer shape as the customer tray 80, and the outer contour of the jig 70 and the outer contour of the customer tray 80 are substantially the same in plan view. The jig 70 is made of a material (e.g., a metal material) different from the material constituting the customer tray 80, and no deformation such as bending has occurred in this jig 70. Further, the jig 70 has two convex portions 71 and 72 in the vicinity of the upper and lower ends in the drawing. Next, in the same manner as in step S10 described above, three-dimensional shape data of the entire jig 70 held by the set plate 43 is acquired by the sensor 51. The shape data is transmitted from the sensor 51 to the calculating device 60. Then, the calculating device 60 extracts the position data of the two convex portions 71 and 72 from the shape data of the jig 70, and calculates the inclination of the jig 70 from these position data, the inclination is stored in advance in the storage unit 66 as the inclination correction amount of the set plate 43.

Instead of the jig 70, a feature such as the above-mentioned convex portions 71 and 72 may be formed on the surface of the set plate 43, and the inclination correction amount of the set plate 43 may be directly obtained by using this feature.

Next, in step S30 of FIG. 6, the extracting unit 62 of the calculating device 60 sets the predetermined region 91 in the shape data of the customer tray 80 corrected by the first correction unit 61, and extracts the height H and inclination θ of the predetermined region 91. This predetermined region 91 is a region corresponding to DUT 90 in the pocket 81 of the customer tray 80. In one or more embodiments, as shown in FIGS. 3 and 4, the predetermined region 91 is a rectangular region corresponding to the central portion of DUT 90 accommodated in the pocket 81 of the customer tray 80 and is set to a region approximately equal to the opening 82 formed in the bottom portion of the pocket 81.

Specifically, the extracting unit 62 obtains the height H of the predetermined region 91 by calculating the average value of the heights of the point data groups in the predetermined region 91. Further, the extracting unit 62 obtains the inclination θ of the predetermined region 91 by creating a plane from the point data group in the predetermined region 91 and calculating the inclination with respect to the vertical direction of the plane.

Next, in S40 of FIG. 6, the first determining unit 63 of the calculating device 60 determines the accommodation state of DUT 90 in the pockets 81 using the height H and inclination θ of the predetermined region 91 extracted by the extracting unit 62.

Specifically, as shown in FIG. 8A, when the height H of the predetermined region 91 in the pocket 81 is greater than or equal to the first threshold Th1 and less than or equal to the second threshold Th2 (Th1≤H≤Th2), and the inclination θ of the predetermined region 91 is greater than or equal to the third threshold Th3 and less than or equal to the fourth threshold Th4 (Th3≤θ≤Th4), the first determining unit 63 determines that DUT 90 is normally accommodated in the pocket 81.

Here, the first to fourth thresholds Th1 to Th4 are threshold values stored in advance in the calculating device 60 for determining the accommodation state of DUT 90. The first threshold Th1 is a threshold for judging so-called "no devices" and is a height lower than the surfaces of DUT 90 normally accommodated in the pockets 81. On the other hand, the second threshold Th2 is a threshold for judging so-called "double placement", is a height higher than the surface of DUT 90 normally accommodated in the pockets 81, and is a threshold greater than the first threshold Th1.

The third and fourth thresholds Th3, Th4 are thresholds for judging the inclination state of DUT 90 in the pocket 81. The third threshold Th3 is a lower limit of the inclination of DUT 90 with respect to the vertical direction. The fourth threshold Th4 is an upper limit of the inclination of DUT 90 with respect to the vertical direction.

On the other hand, as shown in FIG. 8B, when the height H of the predetermined region 91 in the pocket 81 is less than the first threshold Th1 (H<Th1), the first determining unit 63 determines that DUT 90 is not accommodated in the pocket 81 (no devices). That is, when the height H of the predetermined region 91 is less than the first threshold Th1, the first determining unit 63 determines that DUT 90 accommodation state in the pockets 81 is abnormal.

Further, as shown in FIG. 8C, when the height H of the predetermined region 91 in the pocket 81 is greater than the second threshold Th2 (H>Th2), the first determining unit 63 determines that two DUT 90 are accommodated in one pocket 81 (double placement). That is, the first determining unit 63 determines that the accommodation state of DUT 90 in the pockets 81 is abnormal.

Further, as shown in FIG. 8D, when the inclination θ of the predetermined region 91 in the pocket 81 is greater than the fourth threshold Th4 (θ>Th4), the first determining unit 63 determines that DUT 90 is inclined in the pocket 81.

Although not particularly illustrated, when the inclination θ of the predetermined region 91 in the pocket 81 is less than the third threshold Th3 (θ<Th3), the first determining unit 63 also determines that DUT 90 is inclined in the pocket 81. That is, also in these cases, the first determining unit 63 determines that the accommodation state of DUT 90 in the pockets 81 is abnormal.

The extracting unit 62 and the first determining unit 63 of the calculating device 60 execute the processes of steps S30 and S40 for all the pockets 81 of the customer tray 80 (NO in step S50 of FIG. 6). When the processing of steps S30 and S40 is completed for all the pockets 81 (YES in step S50), the second correcting unit 64 of the calculating device 60 corrects the height H and inclination θ of the predetermined region 91 of the pocket 81 in step S60 of FIG. 6 in order to eliminate the influence due to the deflection of the customer tray 80 itself.

Since the amount of deflection is small in a narrow range even if deflection occurs in the customer tray 80, in the correction processing by the second correcting unit 64, the height H and inclination θ of the predetermined region 91 of the target pocket 81A are corrected by comparing the target pocket 81A with the pocket 81B adjacent to the target pocket 81A.

Specifically, as shown in FIG. 9, the second correcting unit 64 calculates a median value of the heights H of the predetermined regions 91 of the eight adjacent pockets 81B around the target pocket 81A, and converts the heights H of the predetermined regions 91 of the target pocket 81A into a relative value with respect to the median value. That is, the second correcting unit 64 converts the height of the predetermined region 91 of the target pocket 81A from the absolute value H into the relative value H', thereby correcting the height of the predetermined region 91 of the target pocket 81A.

For example, as shown in FIG. 10A, when the customer tray 80 has a deflection such that the center portion rises, the second correcting unit 64 performs the above-mentioned correction processing, thereby cutting the deflection from the shape data of the customer tray 80, as shown in FIG. 10B.

Similarly, the second correcting unit 64 calculates a median value of the inclination θ of the predetermined region 81 of the eight adjacent pockets 81B around the target pocket 81A, and converts the inclination θ of the predetermined region 91 of the target pocket 81A into a relative value with respect to the median value. That is, the second correcting unit 64 converts the inclination of the predetermined region 91 of the target pocket 81A from the absolute value θ into the relative value θ', thereby correcting the inclination of the predetermined region 91 of the target pocket 81A.

Note that the number of adjacent pockets 81B present around the target pocket 81A is not particularly limited to the above. For example, if the target pocket 81A is a pocket located at a corner of the customer tray 81, there are only three adjacent pockets 81B. The adjacent pocket 81B is limited to the pocket 81 in which the accommodation state of DUT 90 is determined to be normal by the first determining unit 63. The pocket 81 in which the accommodation state of DUT 90 is determined to be abnormal by the first determining unit 63 is excluded from the adjacent pocket 81B.

Then, in step S70 of FIG. 6, the second determination unit 65 of the calculating device 60 determines again the accommodation state of DUT 90 in the pocket 81 using the height H' and the inclination θ' of the predetermined region 91 corrected by the second correcting unit 64.

Specifically, similarly to the first determining unit 63 described above, when the height H' of the predetermined region 91 in the pocket 81 is greater than or equal to the fifth threshold Th5 and less than or equal to the sixth threshold Th6 (Th5≤H'≤Th6) and the inclination θ' of the predetermined region 91 is greater than or equal to the seventh threshold Th7 and less than or equal to the eighth threshold Th8 (Th7≤θ'≤Th8), the second determining unit 65 determines that DUT 90 is normally accommodated in the pocket 81.

Here, the fifth to eighth thresholds Th5 to Th8 are threshold values stored in advance in the calculating device 60 for determining the accommodation state of DUT 90. The fifth threshold Th5 is a threshold for judging so-called "no devices". On the other hand, the sixth threshold Th6 is a threshold for judging so-called "double placement" and is a threshold greater than the fifth threshold Th5. As shown in FIG. 10A and FIG. 10B, in order to precisely determine the accommodation state of DUT 90, the interval between the fifth threshold Th5 and the sixth threshold Th6 is narrower than the interval between the first threshold Th1 and the second threshold Th2.

The seventh and eighth thresholds Th7, Th8 are thresholds for judging the inclination state of DUT 90 in the pockets 81. The seventh threshold Th7 is the lower limit of the inclination of DUT 90 with respect to the vertical direction. The eighth threshold Th8 is the upper limit of the inclination of DUT 90 with respect to the vertical direction. Although not shown in particular, in order to precisely determine the accommodation state of DUT 90, the angle between the seventh threshold Th7 and the eighth threshold Th8 is narrower than the angle between the third threshold Th3 and the fourth threshold Th4.

On the other hand, although not particularly illustrated, when the height H' of the predetermined region 91 in the pocket 81 is less than the fifth threshold Th5 (H'<Th5), the second determining unit 65 determines that DUT 90 is not accommodated in the pocket 81 (no devices). That is, when the height H' of the predetermined region 91 is less than the fifth threshold Th5, the second determining unit 65 determines that the accommodation state of DUT 90 in the pockets 81 is abnormal.

Further, although not particularly illustrated, when the height H' of the predetermined region 91 in the pocket 81 is greater than the sixth threshold Th6 (H'>Th6), the second determining unit 65 determines that two DUT 90 are accommodated in one pocket 81 (double placement). That is, the second determining unit 65 also determines that the accommodation state of DUT 90 in the pockets 81 is abnormal.

Further, although not particularly illustrated, when the inclination θ' of the predetermined region 91 in the pocket 81 is less than the seventh threshold Th7 (θ<Th7) or greater than the eighth threshold Th8 (θ>Th8), the second determining unit 65 determines that DUT 90 is inclined in the pocket 81. That is, the second determining unit 65 also determines that the accommodation state of DUT 90 in the pockets 81 is abnormal.

The second correcting unit 64 and the second determining unit 65 of the calculating device 60 execute the processes of steps S60 and S70 for all the pockets 81 of the customer tray 80 (NO in step S80 of FIG. 6). When the processes of steps S60 and S70 are completed for all the pockets 81 (YES in step S80), the calculating device 60 outputs, for example, information about the pockets 81 in which DUT 90 is accommodated in an abnormal state to a control unit (not shown) of the pick-and-place device 41.

Thus, the pick-and-place device 41 can recognize in advance the abnormal pocket 81 in which DUT 90 is accommodated in an abnormal state before the pick-and-place device 41 approaches the abnormal pocket 81. Therefore, in one or more embodiments, even if the pockets 81 of "no device" or "double placement" are present in the customer tray 80 or DUT 90 is accommodated in the pockets 81 of the customer tray 80 in inclined state, the pick-and-place device 41 can perform a process of skipping these abnormal pockets 81 and the like, and it is possible to improve the operation rate of the electronic component handling device 1 and to suppress the damage of the DUTs.

When the set plate 43 is inclined, the customer tray 80 held by the set plate 43 is also inclined. For this reason, the height and inclination of DUT 90 accommodated in the customer tray 80 may be changed as compared with the case where the setting plate 43 is not inclined, and the accommodation state of DUT 90 may be erroneously detected.

In contrast, in one or more embodiments, the first correcting unit 61 of the calculating device 60 corrects the shape data of the customer tray 80 on the basis of the inclination of the set plate 43, and the extracting unit 62 extracts the height H and the inclination θ of the predetermined region 91 from the corrected shape data. Therefore, in one or more embodiments, it is possible to exclude the effect of the inclination of the set plate 43, and it is possible to improve the determination accuracy of the accommodation state of DUT 90.

Further, in one or more embodiments, the second correcting unit 64 of the calculating device 60 corrects the height H and the inclination θ of the predetermined region 91 of the target pocket 81A on the basis of the height and inclination of the predetermined region 91 of the adjacent pocket 81B, and the second determining unit 65 again determines the accommodation state of DUT 90 on the basis of the height H' and inclination θ' of the corrected predetermined region 91. For this reason, in one or more embodiments, it is possible to exclude the effect of the deflection occurring in the customer tray 80, and it is possible to further improve the determination accuracy of the accommodation state of DUT 90.

Embodiments heretofore explained are described to facilitate understanding of the present invention and are not described to limit the present invention. It is therefore intended that the elements disclosed in the above embodiments include all design changes and equivalents to fall within the technical scope of the present invention.

In the above-described embodiments, the two determination processes of steps S40 and S70 in FIG. 6 are executed, but the present invention is not particularly limited thereto. For example, only one determination process of step S40 of FIG. 6 may be executed, that is, in this case, the processes of step S60 and subsequent steps of FIG. 6 may be omitted.

In the above-described embodiments, an example in which the present invention is applied to a so-called logic handler has been described, but the present invention is not particularly limited thereto, and may be applied to a so-called memory handler.

In the above-described embodiments, an example in which the present invention is applied to the castor tray 80 held in the set plate 43 has been described, but the present invention is not particularly limited thereto. For example, one or more embodiments of the present invention may be applied to a customer tray which is placed flat on a main base of a handler and functions as a buffer. Alternatively, one or more embodiments of the present invention may be applied to a presicer located between the customer tray and the test tray in order to correct the mutual positional relationship of the DUTs in the memory handler.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

EXPLANATIONS OF LETTERS OR NUMERALS

1 . . . Electronic component testing apparatus
10 . . . Test head
15 . . . Socket
20 . . . Tester
25 . . . Cable
30 . . . Handler
31 . . . Space
32 . . . Opening
33 . . . Main base
34 . . . Window
41 . . . Pick-and-place device
42 . . . Contact arm
43 . . . Set plate
44 . . . Lifting device
50 . . . Accommodation state determining device
51 . . . Sensor
52 . . . Moving device
60 . . . Calculating device
61 . . . First correcting unit
62 . . . Extracting unit
63 . . . First determining unit
64 . . . Second correcting unit
65 . . . Second determining unit
66 . . . Storage unit
70 . . . Jig
71, 72 . . . Convex part
80 . . . Customer tray
81 . . . Pocket
81A . . . Target pocket
81B . . . Adjacent pocket
82 . . . Opening
90 . . . DUT
91 . . . Measurement region
LB . . . Laser beam

What is claimed is:

1. An electronic component handling apparatus that handles a device under test (DUT), the electronic component handling apparatus comprising:
a set plate that holds a DUT container comprising a plurality of pockets each of which is configured to accommodate the DUT;
a sensor that acquires three-dimensional shape data of the DUT container; and
a processor that:
corrects the shape data based on an inclination of the set plate,
extracts a height and an inclination of a predetermined region corresponding to the DUT in a first pocket among the pockets, from the shape data corrected by the processor, and
determines an accommodation state of the DUT in the first pocket based on an extraction result obtained by the processor.

2. The electronic component handling apparatus according to claim 1, wherein
the processor further:
determines that the DUT is not accommodated in the first pocket when the height of the predetermined region is less than a first threshold,
determines that a plurality of DUTs including the DUT are accommodated in the first pocket when the height of the predetermined region is greater than a second threshold that is greater than the first threshold, and
determines that the DUT is normally accommodated in the first pocket when the height of the predetermined region is equal to or greater than the first threshold and equal to or less than the second threshold.

3. The electronic component handling apparatus according to claim 1, wherein
the processor further:
determines that the DUT is inclined in the first pocket when the inclination of the predetermined region is less than a third threshold or greater than a fourth threshold that is greater than the third threshold, and
determines that the DUT is normally accommodated in the first pocket when the inclination of the predetermined region is equal to or greater than the third threshold and equal to or less than the fourth threshold.

4. The electronic component handling apparatus according to claim 1, wherein
the processor further:
corrects the height and the inclination of the predetermined region in the first pocket based on a height and an inclination of a predetermined region corresponding to the DUT in a second pocket among the pockets, wherein the second pocket is adjacent to the first pocket; and
redetermines the accommodation state of the DUT in the first pocket based on the height and the inclination of the predetermined region corrected by the processor, and
in the second pocket, the accommodation state of the DUT is determined as normal by the processor.

5. The electronic component handling apparatus according to claim 4, wherein
the processor further:
determines that the DUT is not accommodated in the first pocket when the height of the predetermined region after correction is less than a fifth threshold,
determines that a plurality of DUTs including the DUT are accommodated in the first pocket when the height of the predetermined region after correcting is greater than a sixth threshold that is greater than the fifth threshold,
determines that the DUT is normally accommodated in the first pocket when the height of the predetermined region after correction is equal to or greater than the fifth threshold and equal to or less than the sixth threshold, and
an interval between the fifth threshold and the sixth threshold is narrower than an interval between the first threshold and the second threshold.

6. The electronic component handling apparatus according to claim 4, wherein
the processor further:
determines that the DUT is inclined in the first pocket when the inclination of the predetermined region after correction is less than a seventh threshold or greater than an eighth threshold, and determines that the DUT is normally accommodated in the first pocket when the inclination of the predetermined region after correction is equal to or greater than the seventh threshold and equal to or less than the eighth threshold, and an angle between the seventh threshold and the eighth threshold is narrower than an angle between the third threshold and the fourth threshold.

7. The electronic component handling apparatus according to claim 1, wherein the DUT container is a tray comprising the pockets each of which has a concave shape and accommodates the DUT.

8. The electronic component handling apparatus according to claim 1, wherein the sensor measures either a specific position of a jig held by the set plate or a specific position of the set plate and acquires the inclination of the set plate in advance.

9. The electronic component handling apparatus according to claim 1, wherein the sensor acquires the three-dimensional shape data of the DUT container by a light-section method, and the processor corrects the shape data so that the DUT container is horizontal based on the inclination of the set plate acquired by the sensor.

10. An electronic component testing apparatus that tests a device under test (DUT), comprising:

a test head that comprises a socket to which the DUT is electrically connected;

an electronic component handling apparatus according to claim 1 that moves the DUT to be pressed against the socket; and a tester that is electrically connected to the test head.

* * * * *